(12) United States Patent
Lee et al.

(10) Patent No.: US 7,580,086 B2
(45) Date of Patent: Aug. 25, 2009

(54) DISPLAY MODULE AND FLEXIBLE PACKAGING UNIT THEREOF

(75) Inventors: Chia-Ming Lee, Taoyuan County (TW); Chun-Han Liu, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 642 days.

(21) Appl. No.: 11/160,595

(22) Filed: Jun. 30, 2005

(65) Prior Publication Data

US 2006/0260977 A1 Nov. 23, 2006

(30) Foreign Application Priority Data

May 19, 2005 (TW) .............................. 94116253 A

(51) Int. Cl.
*G02F 1/1333* (2006.01)
*G02F 1/1345* (2006.01)

(52) U.S. Cl. ........................................ 349/40; 349/150

(58) Field of Classification Search .................. 349/40, 349/150–152; 174/254; 206/709; 361/789
See application file for complete search history.

(56) References Cited

U.S. PATENT DOCUMENTS 6,683,594 B1 * 1/2004 Mori et al. .................... 345/93

7,067,334 B2 * 6/2006 Cho ............................ 438/15

FOREIGN PATENT DOCUMENTS

JP 04-163428 6/1992
JP 2000-028821 1/2000

* cited by examiner

*Primary Examiner*—David Nelms
*Assistant Examiner*—Nathanael R Briggs
(74) *Attorney, Agent, or Firm*—Jianq Chyun IP Office

(57) ABSTRACT

A display module is provided. The display module comprises a display panel, a printed circuit board, and a flexible packaging unit. The display panel has a plurality of first signal pads and at least one first dummy pad. The printed circuit board has a plurality of second signal pads and at least one second dummy pad. In addition, the flexible packaging unit comprises a flexible carrier and a chip, wherein the flexible carrier has a plurality of signal lines and at least one electrostatic discharge protective line. The electrostatic discharge protective line is connected between the first dummy pad and the second dummy pad. Furthermore, the electrostatic discharge protective line has an electricity conducting pad, which is exposed on the surface of the flexible carrier. The chip is disposed on the flexible carrier and connected to the display panel and the printed circuit board through the signal lines.

13 Claims, 3 Drawing Sheets

DISPLAY MODULE AND FLEXIBLE PACKAGING UNIT THEREOF

CROSS-REFERENCE TO RELATED APPLICATION

This application claims the priority benefit of Taiwan application serial no. 94116253, filed on May 19, 2005. All disclosure of the Taiwan application is incorporated herein by reference.

BACKGROUND OF THE INVENTION

1. Field of the Invention

The present invention generally relates to a display module and a flexible packaging unit thereof. More particularly, the present invention relates to the display module and the flexible packaging unit having superior electrostatic discharge (ESD) protective ability.

2. Description of Related Art

In this information explosion age, the market for multimedia is expanding at an ever-increasing rate. Integrated circuit packaging has to follow the market trends demanding for more digital equipment, networking, local area connections and customization. To meet such developmental trends, electronic devices must have high-processing, multi-functional, integrated capacity. Moreover, the devices must be light, compact and have a moderate to low price. Hence, miniaturization and high-level integration are the major driving forces behind the development of a new generation of integrated circuit packages. In the past, most integrated circuit packages were fabricated using wire-bonding technique. However, with an increase in the number of devices packed within a given package, all the devices within the package can no longer be properly linked together due to intrinsic limitations of the wire-bonding technique. Consequently, the tape carrier package (TCP) techniques have been developed.

Generally, the TCP techniques, including tape automated bonding (TAB) and chip on film (COF) bonding techniques, are applied to different fields, such as the electrically connection between a liquid crystal display (LCD) panel and a drive IC. In a bonding process of the LCD panel and the drive IC, a flexible carrier, such as a tape or a film, is provided. Then, the chip is disposed on the flexible carrier by TAB or COF technique to form a packaging unit. Next, the formed packaging unit is connected between the LCD panel and a printed circuit board.

FIG. 1 is a schematic view illustrating a conventional liquid crystal display module. Referring to FIG. 1, a flexible packaging unit 120 comprises a flexible carrier 122 and a drive IC 124, wherein the drive IC is connected between a LCD panel and a printed circuit board 130 through the flexible carrier 122 for driving each pixel in the LCD panel 110 to display.

Since the flexible packaging unit 120 formed by the TCP technique occupy a small volume and are relatively light and flexible, subsequent assembling and packaging are very much facilitated. For example, the flexible packaging unit 120 can be arranged behind the LCD panel 110 for minimizing the thickness of the liquid crystal display module.

However, it should be noted that static electricity can not be completely prevented in the productive process of the liquid crystal display module. Especially, the electricity accumulated on the surface of the packaging unit causes a serious damage to the drive IC. Although the conventional packaging unit usually makes use of a solder mask on the flexible carrier for providing an isolation effect, the static electricity may still accumulate on partial surface of the solder mask due to roughness or defect of the solder mask. Therefore, when the amount of the accumulated static electricity exceeds a critical value, an induced current may punch through the solder mask and damage the drive IC.

SUMMARY OF THE INVENTION

Accordingly, the present invention is directed to a flexible packaging unit, which provides electrostatic discharge protective effect in a display module to improve productive yields.

In addition, the present invention also directed to a display module, which prevents electrostatic discharge by using the above flexible packaging unit and thus has higher productive yields.

The present invention provides a display module, which comprises a display panel, a printed circuit board, and a flexible packaging unit. The display panel has a plurality of first signal pads and at least one first dummy pad. The printed circuit board has a plurality of second signal pads and at least one second dummy pad. In addition, the flexible packaging unit comprises a flexible carrier and a chip, wherein the flexible carrier has a plurality of signal lines and at least one electrostatic discharge protective line. The electrostatic discharge protective line is connected between the first dummy pad and the second dummy pad. Furthermore, the electrostatic discharge protective line has an electricity conducting pad, which is exposed on the surface of the flexible carrier. The chip is disposed on the flexible carrier and connected to the display panel and the printed circuit board through the signal lines.

The present invention also provides a flexible packaging unit, which is suitable for connecting a display panel and a printed circuit board. The flexible packaging unit comprises a flexible carrier and a chip. The flexible carrier has a plurality of signal lines and at least one electrostatic discharge protective line, wherein the electrostatic discharge protective line is connected between the display panel and the printed circuit board, and the electrostatic discharge protective line has an electricity conducting pad, which is exposed on the surface of the flexible carrier. The chip is disposed on the flexible carrier and connected to the display panel and the printed circuit board through the signal lines.

According to an embodiment of the present invention, the electrostatic discharge protective line is connected to a ground terminal or a source terminal through the printed circuit board.

According to an embodiment of the present invention, the electrostatic discharge protective line is connected to a source terminal through a first switching device for providing a discharging path for positive electricity, and connected to a ground terminal through a second switching device for providing a discharging path for negative electricity. For example, the printed circuit board may have a protective circuit, which comprises a first switching device and a second switching device. The first switching device is connected between the second dummy pad and the source terminal, and the second switching device is connected between the second dummy pad and the ground terminal.

According to an embodiment of the present invention, the first switching device and the second switching device may be diodes. In addition, the display panel may be a LCD panel, and the flexible carrier may be a tape or a film.

Accordingly, the flexible carrier of the present invention has the electrostatic discharge protective line, which is connected between the dummy pads on the display panel and the dummy pads on the printed circuit board for providing the discharging path. Therefore, the static electricity accumulated can be eliminated or dispelled, and the productive yields can be improved. Moreover, the present invention can further reduce the amount of rework and the consumption of chip due to the damage caused by the static electricity and thus enhances the performance of the product.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
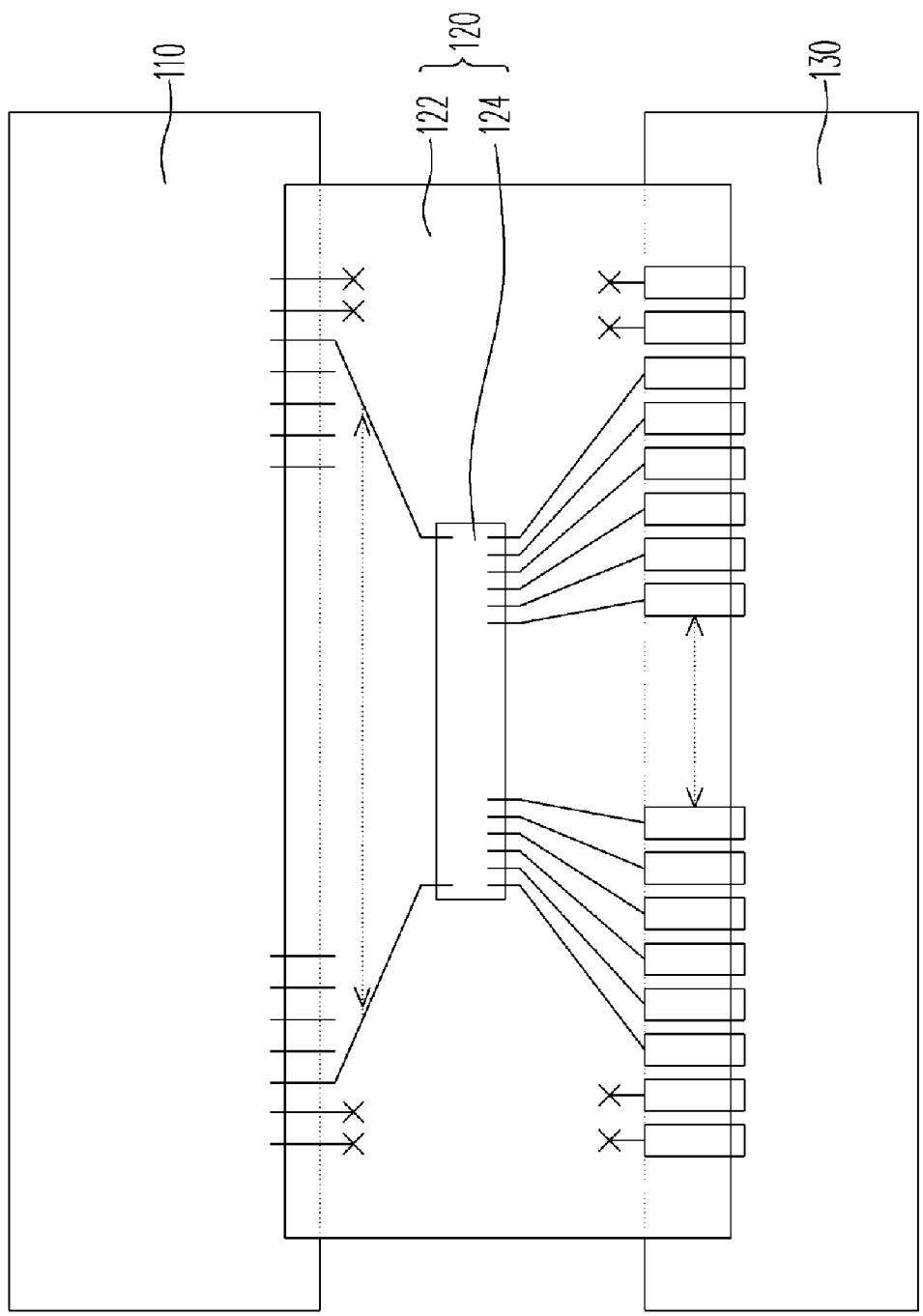
FIG. 1 is a schematic view illustrating a conventional liquid crystal display module.

Reference will now be made in detail to the present preferred embodiments of the invention, examples of which are illustrated in the accompanying drawings. Wherever possible, the same reference numbers are used in the drawings and the description to refer to the same or like parts.

Figure 2:
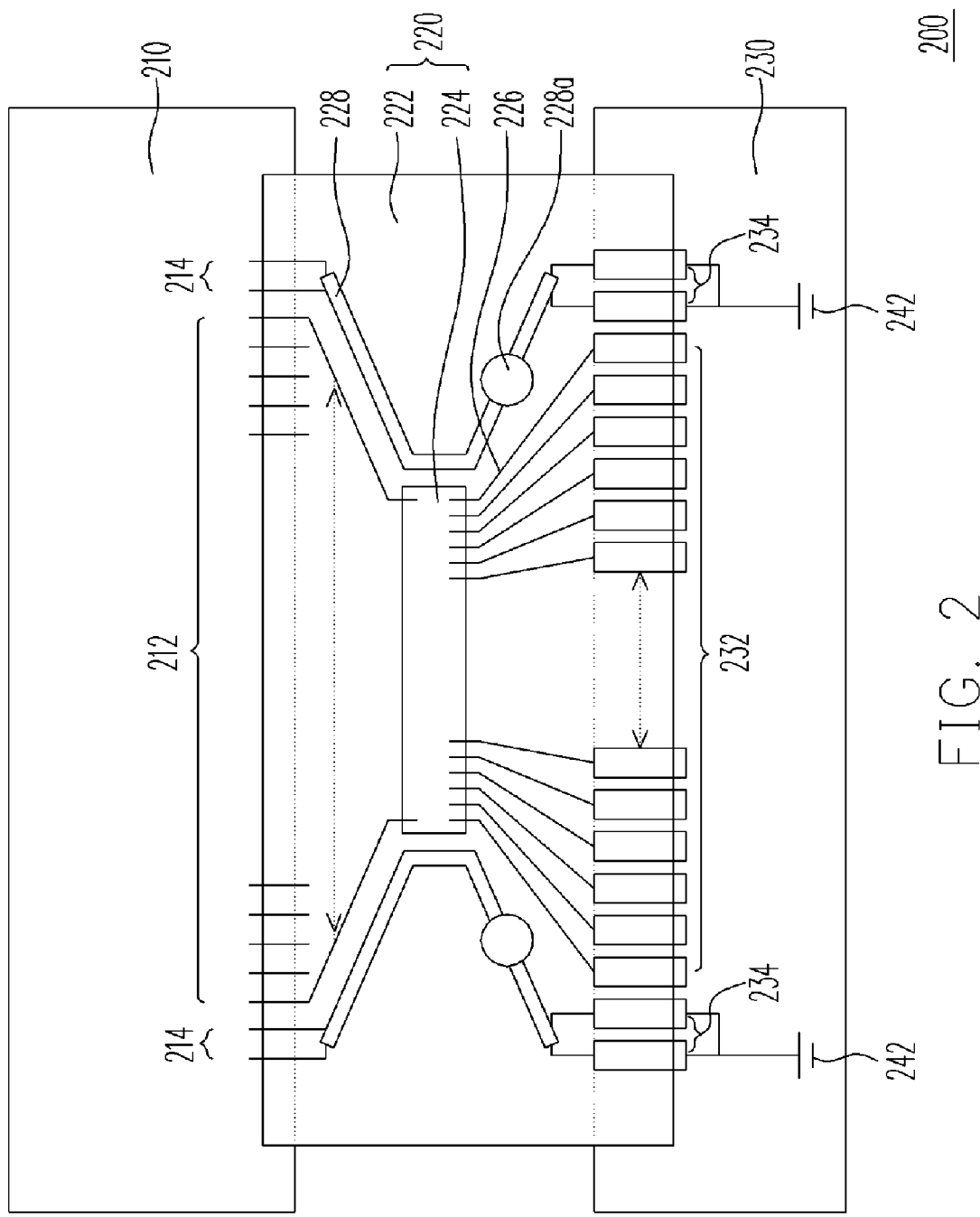
FIG. 2 is a schematic view illustrating a liquid crystal display module according to a preferred embodiment of the present invention.

FIG. 2 is a schematic view illustrating a liquid crystal display module according to a preferred embodiment of the present invention. Referring to FIG. 2, the liquid crystal display module 200 comprises a LCD panel 210, a flexible packaging unit 220, and a printed circuit board 230, wherein the flexible packaging unit 220 is connected between the LCD panel 210 and the printed circuit board 230, and applying driving signals into LCD panel 210 for controlling each pixel in the LCD panel 210 to display.

In more detailed, the LCD panel 210 may have a plurality of signal pads 212, which are disposed in the periphery of the LCD panel 210 and connected to scan lines or data lines (not shown) in the LCD panel 210 for driving the LCD panel 210 by external signals. In addition, the LCD panel 210 further has dummy pads 214 disposed in two sides of the signal pads 232. The dummy pads 214 can increase bonding area between the LCD panel 210 and the flexible packaging unit 220, so as to enhance bonding strength. The printed circuit board 230 may have active or passive device thereon. A plurality of signal pads 232 is disposed at an edge of the printed circuit board 230. Dummy pads 234 are disposed in two sides of the signal pads 232. The dummy pads 214 can increase bonding strength between the printed circuit board 230 and the flexible packaging unit 220.

The flexible packaging unit 220 comprises a flexible carrier 222 and a chip 224, for example, a drive IC. Wherein, the flexible carrier 222 may be a tape or a film, and the flexible carrier 222 has a plurality of signal lines 226 and electrostatic discharge protective lines 228 disposed in two sides of the signal lines 226. The chip 224 is disposed on the flexible carrier 222, wherein the chip 224 and the flexible carrier 222 can be bonded by packaging techniques, such as TAB or COF, according to types of the flexible carrier 222. In addition, an edge of the flexible carrier 222 may be bonded to the signal pads 212 and dummy pads 214 of the LCD panel 210 through anisotropic conductive paste (ACP), and the other edge of the flexible carrier 222 may be bonded to the signal pads 232 and dummy pads 234 of the printed circuit board 230 through ACP. Wherein, through the ACP, the signal lines 226 are connected between the LCD panel 210 and the chip 224, and between the printed circuit board 230 and chip 224. In addition, the electrostatic discharge protective lines 228 at two sides of the signal lines 226 are connected between the dummy pads 214 of the LCD panel 210 and the dummy pads 234 of the printed circuit board 230 through ACP.

Referring to FIG. 2, each electrostatic discharge protective line 228 has an electricity conducting pad 228a exposed on the surface of the flexible carrier 222, wherein static electricity accumulated on the surface of the flexible carrier 222 can be conducted into the electrostatic discharge protective line 228 through the electricity conducting pad 228a, and the electrostatic discharge protective line 228 is connected to a ground terminal 242 (or source terminal) for providing a electrostatic discharging path. In an embodiment, the electricity conducting pad 228a can be fabricated by forming an opening in the solder mask on the surface of the flexible carrier 222 for exposing a portion of the electrostatic discharge protective line 228. In another embodiment, a pad can be formed out the electrostatic discharge protective line 228 and connected thereto for being as the electricity conducting pad 228a. It should be noted that the electrostatic discharge protective lines 228 and the electricity conducting pads 228a can be disposed close to the chip 224 and the signal lines 226 for providing superior electrostatic discharge protective effect. However, there is no set limit on the position or the amount of the electrostatic discharge protective lines 228 and the electricity conducting pads 228a in the present invention, one of ordinary skill in the art may select an appropriate arrangement according to a practical necessary.

In the embodiment mentioned above, the electrostatic discharge protective lines and the electricity conducting pads are formed on the flexible carrier, and connected to the dummy pads on the LCD panel and the printed circuit board. Therefore, the electrostatic protective effect can be attained without modifying the original circuit design of the printed circuit board or the LCD panel.

Besides the above embodiment, the present invention can further form an electrostatic discharge protective circuit on the printed circuit board to provide discharging paths for positive electricity and negative electricity simultaneously.

Figure 3:
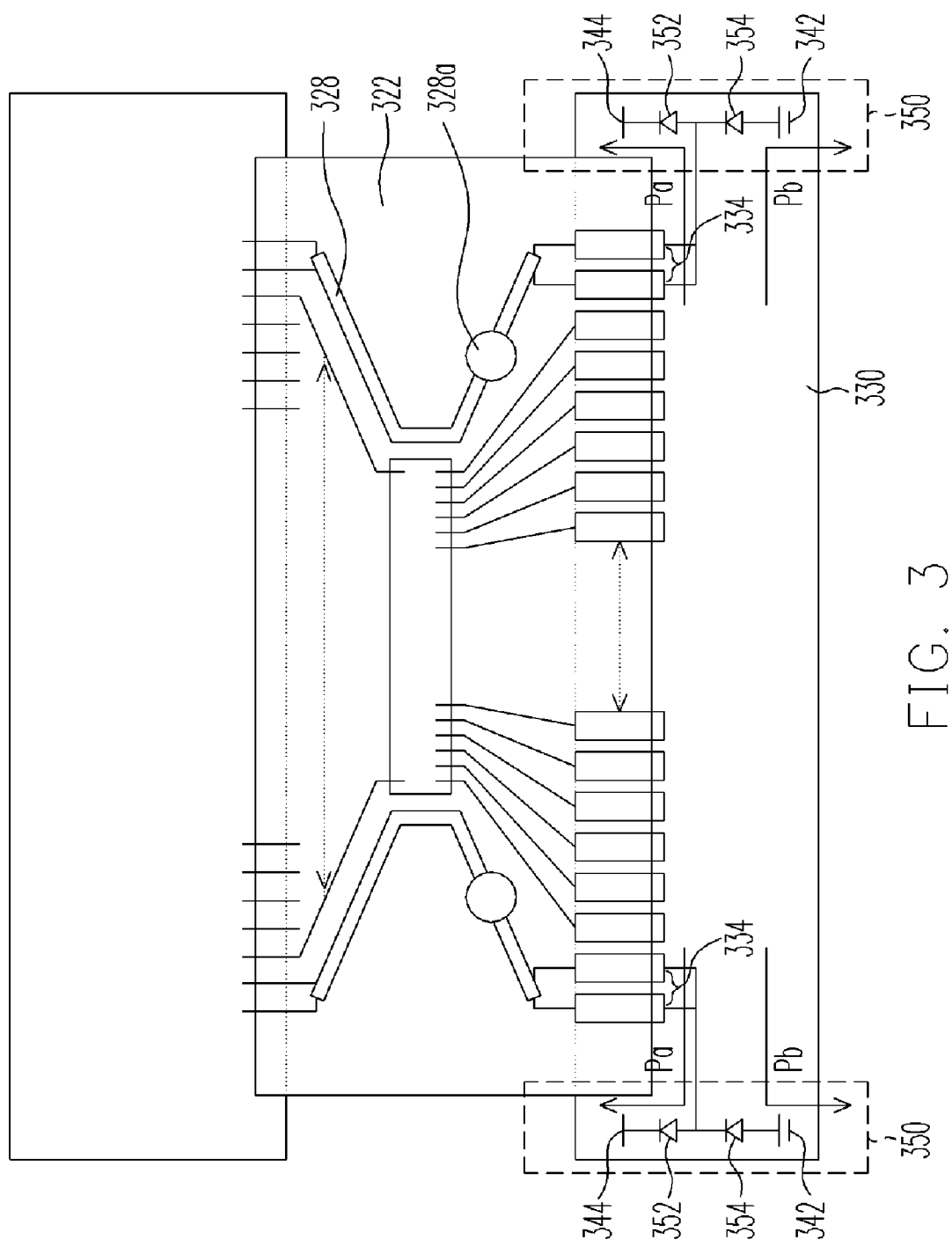
FIG. 3 is a schematic view illustrating another liquid crystal display module according to a preferred embodiment of the present invention.

FIG. 3 is a schematic view illustrating another liquid crystal display module according to a preferred embodiment of the present invention. Referring to FIG. 3, the printed circuit board 330 has protective circuits 350, which are connected to dummy pads 334 respectively. Each protective circuit 350 comprises a first switching device 352 and a second switching device 354. In the present invention, each first switching device 352 is connected between one of the dummy pads 334 and a source terminal 344 for providing a discharging path Pa for positive electricity. The positive electricity accumulated on the surface of the flexible carrier 322 can be conducted into the electrostatic discharge protective line 328 through the electricity conducting pad 328a, and then passes through the dummy pads 334, the first switching device 352, to the source terminal 344. In addition, each second switching device 354 is connected between one of the dummy pads 334 and a ground terminal 342 for providing a discharging path Pb for negative electricity. The negative electricity accumulated on the surface of the flexible carrier 322 can be conducted into the electrostatic discharge protective line 328 through the electricity conducting pad 328a, and then passes through the dummy pads 334, the second switching device 354, to the ground terminal 342.

In an embodiment, the first switching device 352 and the second switching device 354 may be diodes or other appropriate semi-conductive devices. However, since other elements have been described in the aforementioned embodiment, details are not repeated here.

In summary, the present invention forms discharging paths on the flexible carrier for dispelling static electricity, wherein the discharging paths comprises electricity conducting pads on the surface of the flexible carrier and the electrostatic discharge protective lines connected between the dummy pads of the LCD panel and the dummy pads of the printed circuit board. Furthermore, the printed circuit board may have protective circuit for providing electrostatic discharging paths for positive and negative electricity simultaneously. The liquid crystal display module and the flexible packaging unit of the present invention can provide superior electrostatic discharge protective effect to prevent the chip from being damaged by static electricity. Therefore, the productive yields and the reliability of the liquid crystal display module can be enhanced. And, the consumption of time and cost of rework due to the damage of the chip caused by the static electricity can be reduced and thus the performance of the product is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A display module, comprising:
   a display panel, having a plurality of first signal pads and at least one first dummy pad;
   a printed circuit board, having a plurality of second signal pads and at least one second dummy pad;
   a flexible packaging unit, comprising:
   a flexible carrier, having a plurality of signal lines and at least one electrostatic discharge protective line, wherein the electrostatic discharge protective line is connected between the first dummy pad and the second dummy pad, and the electrostatic discharge protective line has an electricity conducting pad, which is exposed on the surface of the flexible carrier; and
   a chip, disposed on the flexible carrier and connected to the display panel and the printed circuit board through the signal lines,
   wherein the printed circuit board has a protective circuit comprising:
   a first switching device, connected between the second dummy pad and a source terminal for providing a discharging path for positive electricity; and
   a second switching device, connected between the second dummy pad and a ground terminal for providing a discharging path for negative electricity.

2. The display module according to claim 1, wherein the electrostatic discharge protective line is connected to a ground terminal or a source terminal through the printed circuit board.

3. The display module according to claim 1, wherein the first switching device is a diode.

4. The display module according to claim 1, wherein the second switching device is a diode.

5. The display module according to claim 1, wherein the display panel is a liquid crystal display panel.

6. The display module according to claim 1, wherein the flexible carrier is a tape or a film.

7. A flexible packaging unit, suitable for connecting a display panel and a printed circuit board, the flexible packaging unit comprising:
   a flexible carrier, having a plurality of signal lines and at least one electrostatic discharge protective line, wherein the electrostatic discharge protective line is connected between the display panel and the printed circuit board, and the electrostatic discharge protective line has an electricity conducting pad, which is exposed on the surface of the flexible carrier; and
   a chip, disposed on the flexible carrier and connected to the display panel and the printed circuit board through the signal lines,
   wherein the electrostatic discharge protective line is connected to a source terminal through a first switching device for providing a discharging path for positive electricity, and connected to a ground terminal through a second switching device for providing a discharging path for negative electricity.

8. The flexible packaging unit according to claim 7, wherein the display panel has at least one first dummy pad, the printed circuit board has at least one second dummy pad, and the electrostatic discharge protective line is connected between the first dummy pad and the second dummy pad.

9. The flexible packaging unit according to claim 7, wherein the electrostatic discharge protective line is connected to a ground terminal or a source terminal through the printed circuit board.

10. The flexible packaging unit according to claim 7, wherein the first switching device is a diode.

11. The flexible packaging unit according to claim 7, wherein the second switching device is a diode.

12. The flexible packaging unit according to claim 7, wherein the flexible carrier is a tape or a film.

13. The flexible packaging unit according to claim 1, wherein the electrostatic discharge protective line is connected to the source terminal through the first switching device for providing the discharging path for positive electricity, and connected to the ground terminal through the second switching device for providing the discharging path for negative electricity.

* * * * *